United States Patent
Lee et al.

(10) Patent No.: US 7,847,410 B2
(45) Date of Patent: Dec. 7, 2010

(54) INTERCONNECT OF GROUP III-V SEMICONDUCTOR DEVICE AND FABRICATION METHOD FOR MAKING THE SAME

(75) Inventors: Cheng-Shih Lee, Taoyuan County (TW); Edward Yi Chang, Hsinchu (TW); Huang-Choung Chang, Miaoli County (TW)

(73) Assignee: National Chiao Tung University, Hsinchu (TW)

( * ) Notice: Subject to any disclaimer, the term of this patent is extended or adjusted under 35 U.S.C. 154(b) by 243 days.

(21) Appl. No.: 11/164,404

(22) Filed: Nov. 22, 2005

(65) Prior Publication Data

US 2007/0040274 A1 Feb. 22, 2007

(30) Foreign Application Priority Data

Aug. 22, 2005 (TW) ................ 94128569 A

(51) Int. Cl.
*H01L 23/48* (2006.01)
(52) U.S. Cl. ........... 257/776; 257/522; 257/745; 257/753; 257/757; 257/768; 438/167; 438/172; 438/170; 438/619
(58) Field of Classification Search ........ 257/565, 257/745, 751, 753, 522, 757, 766, 768, 776; 438/167, 172, 170, 619
See application file for complete search history.

(56) References Cited

U.S. PATENT DOCUMENTS

| | | | | |
|---|---|---|---|---|
| 4,933,743 A | * | 6/1990 | Thomas et al. ........... 257/742 |
| 6,146,931 A | * | 11/2000 | Nunokawa et al. ........ 438/172 |
| 6,376,370 B1 | * | 4/2002 | Farrar .................... 438/678 |
| 6,821,886 B1 | * | 11/2004 | Layadi et al. ............ 438/653 |
| 6,822,307 B2 | * | 11/2004 | Nihei et al. .............. 257/473 |
| 6,867,078 B1 | * | 3/2005 | Green et al. ............. 438/167 |
| 6,872,966 B2 | * | 3/2005 | Akiyama et al. .......... 257/14 |
| 6,958,291 B2 | * | 10/2005 | Yu et al. ................. 438/637 |
| 7,420,227 B2 | * | 9/2008 | Chang et al. ............ 257/197 |
| 2003/0111441 A1 | * | 6/2003 | Jerominek et al. ........ 216/39 |
| 2005/0017355 A1 | * | 1/2005 | Chou et al. .............. 257/738 |
| 2006/0027925 A1 | * | 2/2006 | Huang et al. ............. 257/751 |
| 2006/0091426 A1 | * | 5/2006 | Hara ..................... 257/211 |
| 2006/0118823 A1 | * | 6/2006 | Parikh et al. ............ 257/194 |
| 2006/0121669 A1 | * | 6/2006 | Pierson et al. ........... 438/235 |
| 2006/0166390 A1 | * | 7/2006 | Letertre et al. .......... 438/34 |
| 2006/0210705 A1 | * | 9/2006 | Itoh et al. ............... 427/96.1 |

* cited by examiner

*Primary Examiner*—N Drew Richards
*Assistant Examiner*—Jae Lee
(74) *Attorney, Agent, or Firm*—Jianq Chyun IP Office

(57) ABSTRACT

An interconnect of the group III-V semiconductor device and the fabrication method for making the same are described. The interconnect includes a first adhesion layer, a diffusion barrier layer for preventing the copper from diffusing, a second adhesion layer and a copper wire line. Because a stacked-layer structure of the first adhesion layer/diffusion barrier layer/second adhesion layer is located between the copper wire line and the group III-V semiconductor device, the adhesion between the diffusion barrier layer and other materials is improved. Therefore, the yield of the device is increased.

11 Claims, 5 Drawing Sheets

INTERCONNECT OF GROUP III-V SEMICONDUCTOR DEVICE AND FABRICATION METHOD FOR MAKING THE SAME

CROSS-REFERENCE TO RELATED APPLICATION

This application claims the priority benefit of Taiwan application serial no. 94128569, filed on Aug. 22, 2005. All disclosure of the Taiwan application is incorporated herein by reference.

BACKGROUND OF THE INVENTION

1. Field of the Invention

The present invention relates to an interconnect of the group III-V semiconductor device and a fabrication method for making the same, and particularly to a copper interconnect of the group III-V semiconductor device and a fabrication method for making the same.

2. Description of the Prior Art

The conventional group III-V semiconductor devices, for example, gallium arsenide (GaAs) devices, which include hetero-junction bipolar transistor (HBT), high electron mobility transistor (HEMT) and metal-semiconductor field-effect transistor (MESFET), all use gold as the material of the metal line. However, as the line width of the metal line reduces gradually, the current density carried by the metal line increases accordingly. For the conventional metal line mainly made of gold, the resistance of the gold metal line may become higher and higher. Moreover, because the thermal conductive coefficient of gold is small, the thermal conductive property of the high speed semiconductor device is affected. If the heat cannot be transferred to outside easily, the electrical property and reliability of the device will be adversely affected as the temperature of the device rises.

SUMMARY OF THE INVENTION

Therefore, it is an object of the present invention to provide an interconnect of the group III-V semiconductor device to reduce the resistance of the conductive line.

It is another object of the present invention to provide a fabrication method for making an interconnect of the group III-V semiconductor device to increase the process window of the interconnect.

The present invention provides an interconnect of the group III-V semiconductor device, suitable for connecting group III-V semiconductor devices. The interconnect includes a first adhesion layer, a diffusion barrier layer, a second adhesion layer and a copper wire line. The first adhesion layer is disposed on a part of the group III-V semiconductor device. The diffusion barrier layer is disposed on the first adhesion layer. The second adhesion layer is disposed on the diffusion barrier layer. And the copper wire line is disposed on the second adhesion layer.

In one embodiment, the above group III-V semiconductor device is, for example, a hetero-junction bipolar transistor.

In one embodiment, the above copper wire line is, for example, a copper air bridge. The group III-V semiconductor device using the copper air bridge is, for example, a high electron mobility transistor or a metal-semiconductor field-effect transistor.

In one embodiment, the thickness of the above diffusion barrier layer is between 100 Å to 8000 Å.

In one embodiment, the material of the above first adhesion layer and second adhesion layer is, for example, titanium, titanium tungsten alloy or chromium.

In one embodiment, the thickness of the above first adhesion layer and second adhesion layer is between 100 Å to 5000 Å.

In one embodiment, the above group III-V semiconductor device is, for example, a gallium arsenide (GaAs) device.

The interconnect of the group III-V semiconductor device of the present invention is a stacked-layer structure of adhesion layer/diffusion barrier layer/adhesion layer located between the group III-V semiconductor device and the copper wire line, so that the diffusion barrier layer is ensured to be adhered to the group III-V semiconductor device, the dielectric layer and the copper wire line effectively, thus keeping the copper of the copper wire line from diffusing into the group III-V semiconductor device.

The present invention further provides a method for fabricating an interconnect of the group III-V semiconductor device, which comprises the following steps: forming an intermediate layer on a group III-V semiconductor device; defining a plurality of openings that expose a part of the group III-V semiconductor device in the intermediate layer; and forming a first adhesion layer on the exposed part of the group III-V semiconductor device; forming a diffusion barrier layer on the first adhesion layer; forming a second adhesion layer on the diffusion barrier layer; and forming a copper layer on the second adhesion layer.

In one embodiment, the above intermediate layer is a photoresist, and will be removed after the copper layer is formed on the second adhesion layer.

In one embodiment, the method for forming the above diffusion barrier layer is, for example, sputtering or E-beam evaporation.

In one embodiment, the method for forming the above first adhesion and second adhesion layer is, for example, sputtering or evaporation. The material of the first adhesion layer and the second adhesion layer is, for example, titanium, titanium tungsten alloy or chromium.

In one embodiment, the above group III-V semiconductor device is, for example, a GaAs device. The GaAs device is, for example, a hetero-junction bipolar transistor (HBT), a high electron mobility transistor (HEMT) or a metal-semiconductor field-effect transistor (MESFET).

In one embodiment, the method for forming the copper layer on the second adhesion layer is, for example, sputtering, evaporation, copper chemical vapor deposition or chemical plating.

In one embodiment, the intermediate layer is a dielectric layer, which is made of for example, polyimide or benzocyclobutene (BCB) and the like.

The fabrication method of making an interconnect of the group III-V semiconductor device provided by the present invention is characterized in that forming a stacked-layer structure of adhesion layer/diffusion barrier layer/adhesion layer at the interface between the group III-V semiconductor device and the copper wire line, so as to ensure the diffusion barrier layer adhere to the group III-V semiconductor device, the intermediate layer and the copper layer effectively, thus preventing the copper of the copper wire line from diffusing into the group III-V semiconductor device.

The above objects and other objects, features or advantages of the present invention will become apparent from the preferred embodiments given hereinafter in conjunction with the accompanying figures.

DETAILED DESCRIPTION

Embodiment 1

Figure 1A:
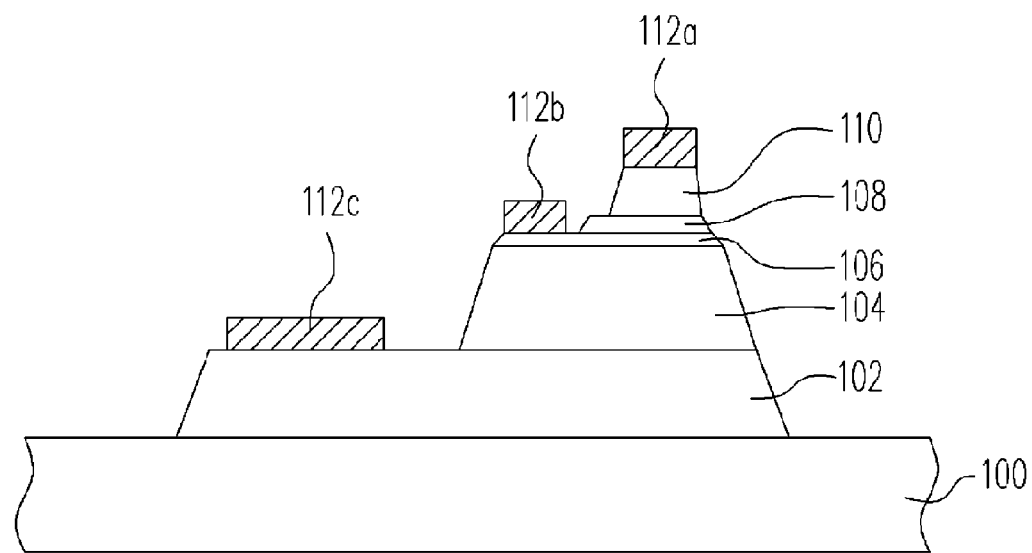
FIG. 1A to FIG. 1D are the cross-sectional views of the process steps for fabricating the interconnect of the group III-V semiconductor device according to Embodiment 1 of the present invention.

FIG. 1A to FIG. 1D are the cross-sectional views of the process steps for fabricating the interconnect of the group III-V semiconductor device according to Embodiment 1 of the present invention. Referring to FIG. 1A, a group III-V semiconductor device is firstly provided. This group III-V semiconductor device indicates a semiconductor device consisting of a group III-V element from the periodic table, for example, a GaAs device. In this embodiment, the GaAs device is a hetero-junction bipolar transistor, but the scope of this invention is not limited to this example. Alternatively, this GaAs device can also be a high electron mobility transistor, a metal-semiconductor field-effect transistor or a monolithic microwave integrated circuit in other embodiments. The hetero-junction bipolar transistor is constituted by stacking a subcollector layer 102, collector layer 104, base layer 106, emitter layer 108 and contact layer 110 sequentially on the substrate 100. The subcollector layer 102 is disposed on the substrate 100, and the subcollector layer 102 is made of, for example, n+ GaAs. The collector layer 104 is disposed on the subcollector layer 102, and the collector layer 104 is made of, for example, n− GaAs. The base layer 106 is disposed on the collector layer 104, and the base layer 106 is made of, for example, p+ GaAs. The emitter layer 108 is disposed on a part of the base layer 106, and the emitter layer 108 is made of, for example, AlGaAs. The contact layer 110 is disposed on a part of the emitter layer 108, and the contact layer 110 is made of, for example, n+ GaAs.

In addition, several metal layers 112a, 112b and 112c are further disposed on the group III-V semiconductor device. The metal layers 112a and 112c adjacent to n-type GaAs (subcollector layer 102 or contact layer 110) are, for example, AuGe/Ni/Au stacked layers, while metal layer 112b adjacent to p-type GaAs (base layer 106) is, for example, the Pt/Ti/Pt/Au stacked layer.

Figure 1B:
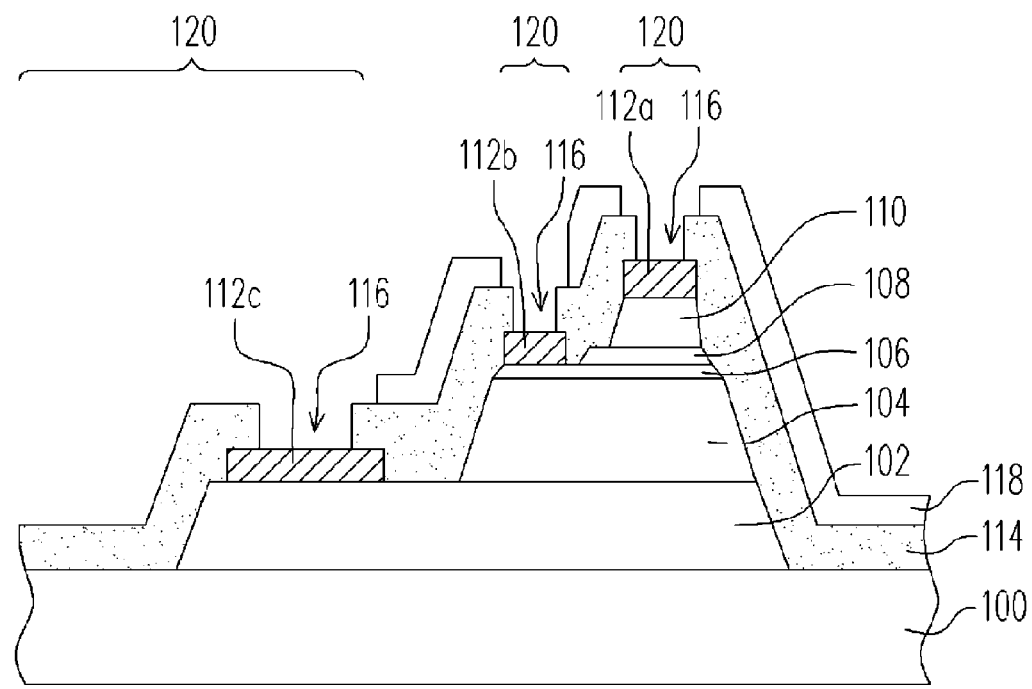

Then, referring to FIG. 1B, a dielectric layer 114 is formed on the group III-V semiconductor device and the metal layers 112a, 112b, 112c. The dielectric layer 114 is made of, for example, silicon dioxide, silicon nitride, polyimide or benzocyclobutene and the like. After that, several openings 116, which expose the metal layer 112, are formed in the dielectric layer 114. Then, a patterned mask layer 118 is formed on the dielectric layer 114 so as to define the desired interconnect region 120 and expose the openings 116.

Figure 1C:
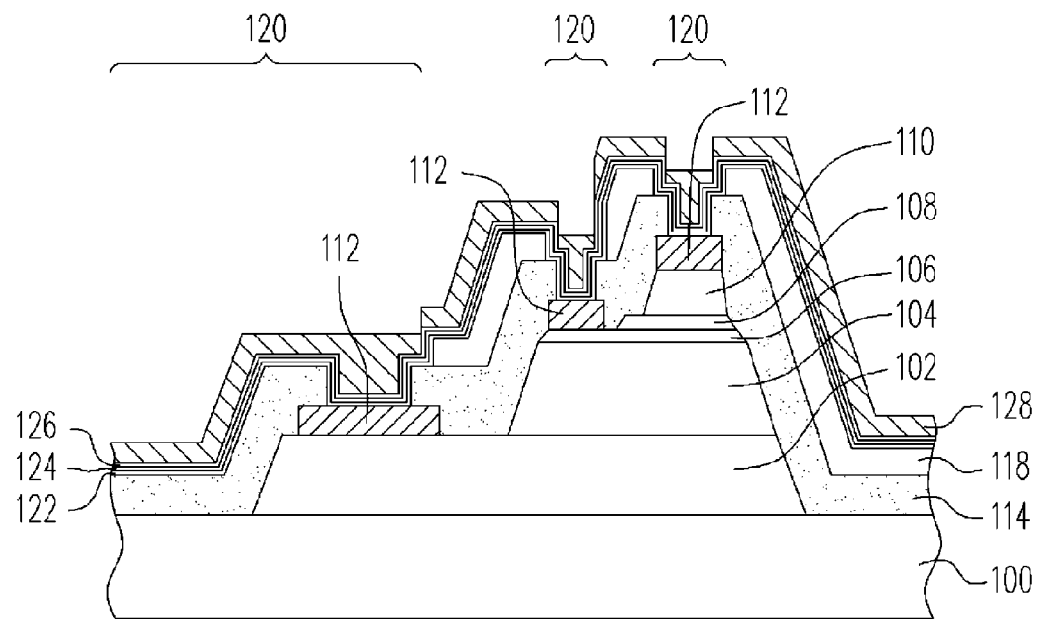

After that, referring to FIG. 1C, a conformal adhesion layer 122, a conformal diffusion barrier layer 124 and a conformal adhesion layer 126 are sequentially formed on the patterned mask layer 118, a part of the dielectric layer 114, sidewalls of the openings 116 and the exposed metal layers 112a, 112b and 112c. The adhesion layers 122, 126 are made of, for example, titanium, titanium tungsten alloy or chromium by, for example, sputtering or evaporation. The thickness of the adhesion layers 122, 126, for example, is between 100 Å to 5000 Å. The diffusion barrier layer 124 is made of, for example, Ta, TaN, W, $WN_x$, $TiWN_x$ or Pd, by, for example, sputtering or E-beam evaporation. The thickness of the diffusion barrier layer 124 is, for example, 100 Å to 8000 Å. Subsequently, a copper layer 128 is formed on the adhesion layer 126 by, for example, sputtering, evaporation, copper chemical vapor deposition. Then, the copper layer 128 were plating to the thickness range from 200 nm to 3 μm.

Figure 1D:
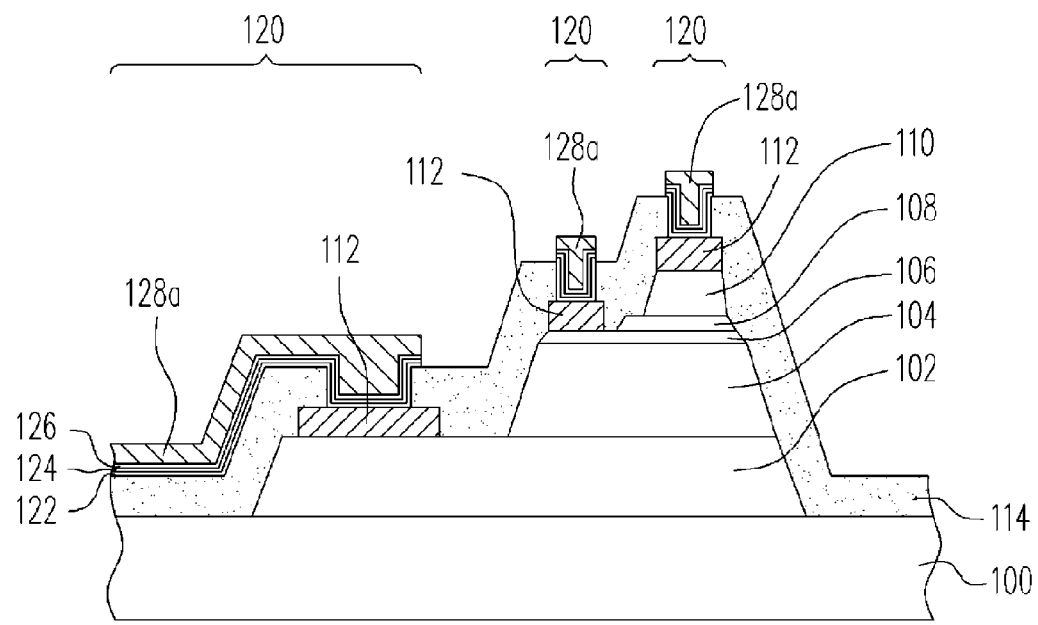

Next, referring to FIG. 1D, the patterned mask layer 118, and a part of the adhesion layer 122, a part of the diffusion barrier layer 124, a part of the adhesion layer 126 and a part of the copper layer 128 thereon are removed by using acetone, so that the copper layer 128 within the interconnect region 120 is remained, thus forming a copper wire line 128a.

The fabrication method for making an interconnect of the group III-V semiconductor device in the present invention comprises forming a stacked-layer structure of adhesion layer 122/diffusion barrier layer 124/adhesion layer 126 at the interface between the group III-V semiconductor device and the copper wire line, so as to ensure the diffusion barrier layer 124 adhere to the metal layers 112a, 112b, 112c, the dielectric layer 114 and the copper layer 128 effectively, thus preventing diffusion of the copper layer 128 into the dielectric layer 114 or metal layers 112a, 112b and 112c.

The application of the stacked-layer structure of adhesion layer/diffusion barrier layer/adhesion layer in the fabrication of the interconnect of the group III-V semiconductor device will be illustrated in another embodiment.

Embodiment 2

Figure 2A:
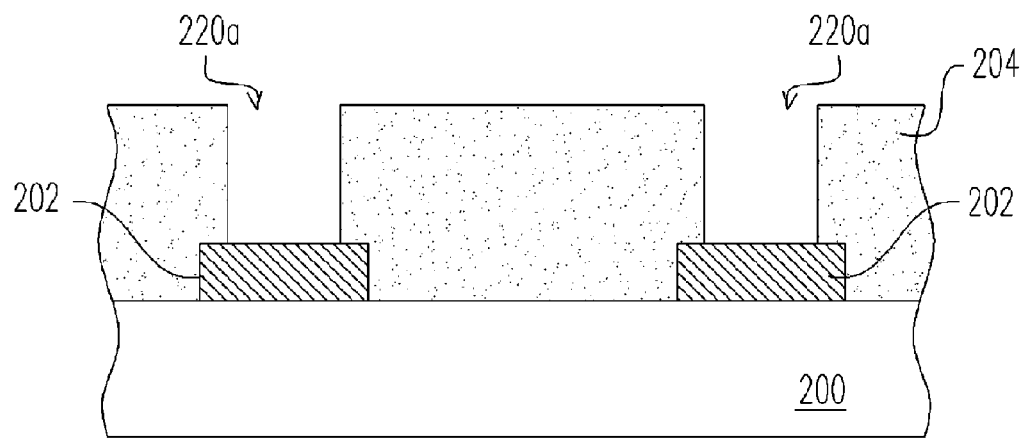
FIG. 2A to FIG. 2E are the cross-sectional views of the process steps for fabricating the interconnect of the group III-V semiconductor device according to Embodiment 2 of the present invention.
Figure 2B:
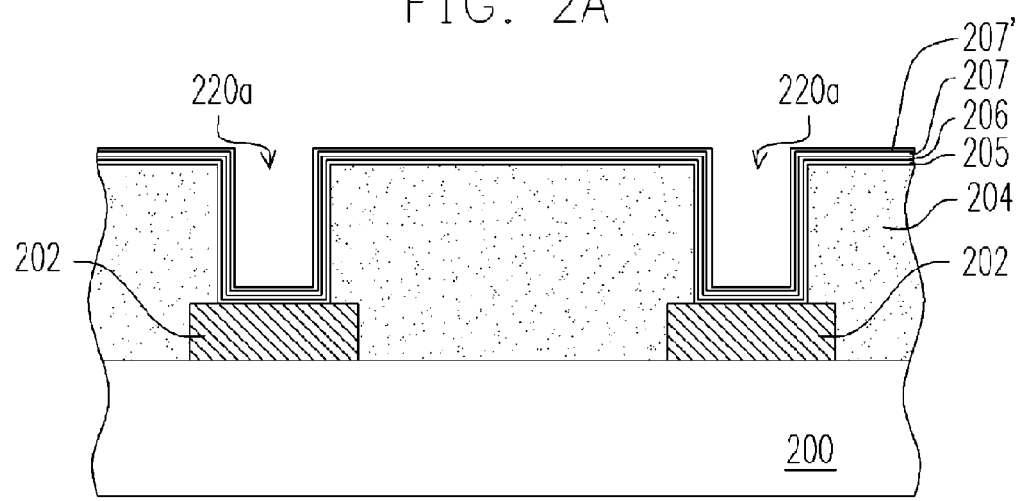
Figure 2C:
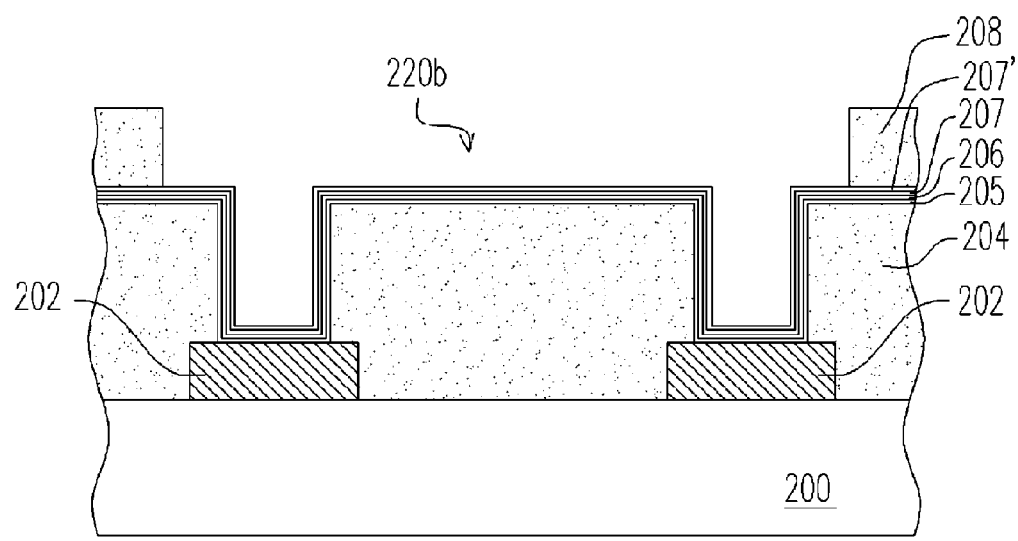
Figure 2D:
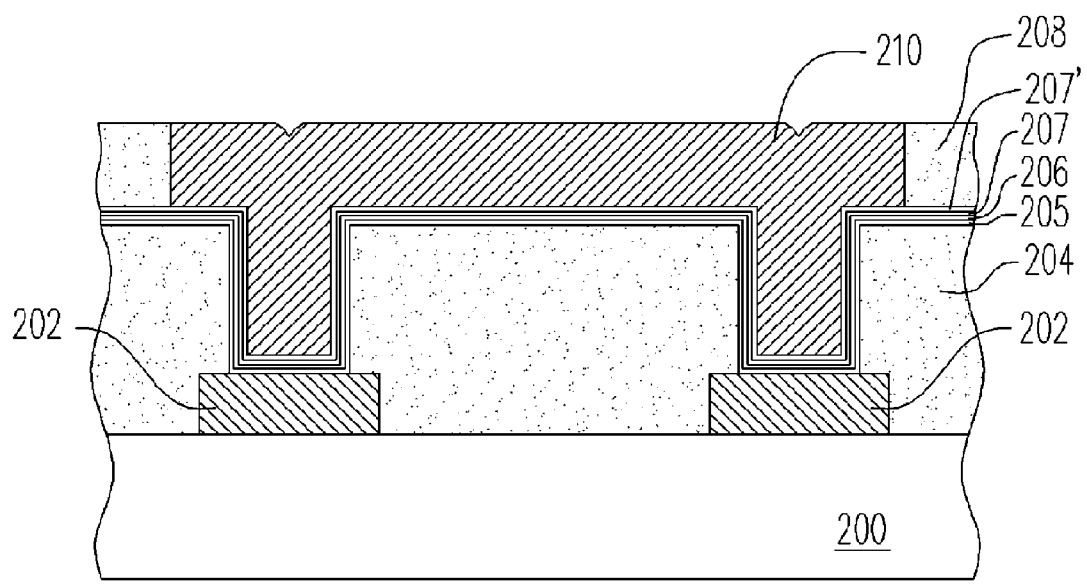
Figure 2E:
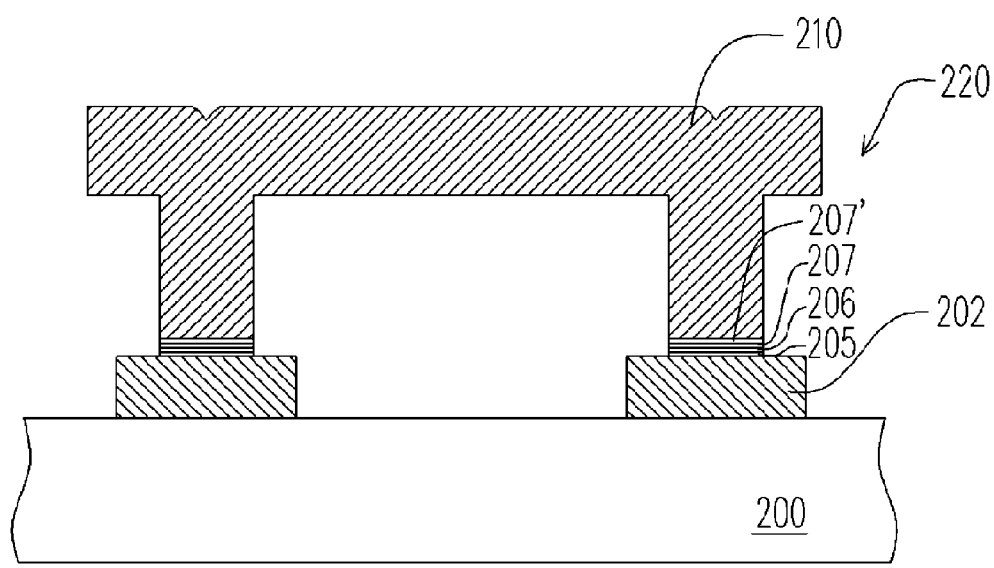

FIG. 2 A to FIG. 2E are the cross-sectional views of the process steps for fabricating the interconnect of the group III-V semiconductor device according to Embodiment 2 of the present invention. Referring to FIG. 2A, a group III-V semiconductor device 200 is firstly provided. This group III-V semiconductor device 200 is, for example, a GaAs device. In this embodiment, the GaAs device may be a hetero-junction bipolar transistor, a high electron mobility transistor, a metal-semiconductor field-effect transistor or a monolithic microwave integrated circuit. Furthermore, several metal layers 202 are disposed on the group III-V semiconductor device 200. The metal layers 202 are, for example, AuGe/Ni/Au stacked layers or Pt/Ti/Pt/Au stacked layers. Then, an intermediate layer 204 is formed on the group III-V semiconductor device 200. The intermediate layer 204 is made of a photoresist material, for example. The opening 220a, which exposes the metal layer 202, is formed in the intermediate layer 204, and the opening 220a defines a pier region in the metal layer 202 for a subsequently formed copper air bridge.

And then, referring to FIG. 2B, a conformal adhesion layer 205, a conformal diffusion barrier layer 206 and a conformal adhesion layer 207 and copper seed layer 207' are sequentially formed on the intermediate layer 204, the sidewall of the opening 220a, and the exposed group III-V semiconductor device 200. The adhesion layers 205, 207 are made of, for example, titanium, titanium tungsten alloy or chromium by, for example, sputtering or evaporation. The thickness of the adhesion layers 205, 207 is, for example, between 100 Å to 5000 Å. The diffusion barrier layer 206 is made of for example, Ta, TaN, W, $WN_x$, $TiWN_x$ or Pd by, for example, sputtering or E-beam evaporation. The thickness of the diffusion barrier layer 206 is, for example, between 100 Å to 8000 Å.

Subsequently, referring to FIG. 2C, another intermediate layer 208 is formed over the group III-V semiconductor device. The intermediate layer 208 is made of, a photoresist material, for example. The intermediate layer 208 has an opening 220b which exposes a part of the adhesion layer 207 so as to define the location of the conductive line of the above copper air bridge.

Subsequently, referring to 2D, a copper layer 210 is formed in the openings 220a, 220b, so as to form a copper wire line. The method for forming the copper layer 210 is, for example, electrical plating. If the copper layer 210 is formed by sputtering, the collimator technique can be used at the same time so as to achieve a better orientation.

Referring to FIG. 2E, the remaining intermediate layers 204, 208, as well as a part of the adhesion layer 205, a part of the diffusion barrier layer 206, a part of the adhesion layer 207 and a part of the copper layer 207 on the intermediate layer 204 are removed by acetone, chemical etching solution and plasma, so as to form a copper air bridge 220.

A stacked-layer structure of adhesion layer/diffusion barrier layer/adhesion layer is formed at the interface between the group III-V semiconductor device and the copper air bridge in the present invention, so as to ensure the diffusion barrier layer 206 adhere to the metal layer 202 and the copper layer 210 effectively, thus preventing the diffusion of the copper layer 210 into the metal layer 202.

Embodiment 3

Figure 3:
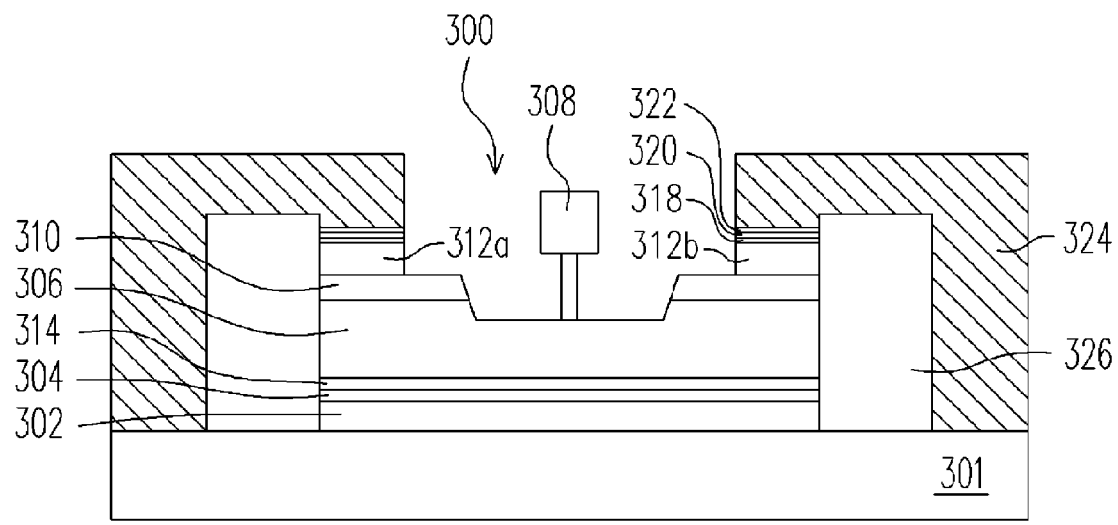
FIG. 3 is a schematic cross-sectional view of the interconnect of the group III-V semiconductor device according to Embodiment 3 of the present invention.

FIG. 3 is a schematic cross-sectional view of the interconnect of the group III-V semiconductor device according to Embodiment 3 of the present invention. This group III-V semiconductor device is, for example, a GaAs device. This interconnect is suitable for connecting the group III-V semiconductor device 300. In this embodiment, the group III-V semiconductor device 300 is a high electron mobility transistor, but is not limited to this. Alternatively, the group III-V semiconductor device 300 may be a hetero-junction bipolar transistor, a metal-semiconductor field-effect transistor or a monolithic microwave integrated circuit. This high electron mobility transistor is constituted by a substrate 301, a buffer layer 302, a channel layer 304, a barrier layer 306, a gate 308, a cover layer 310, a source 312a, a drain 312b and an isolation layer 314(delete). The substrate 301 is made of, for example, GaAs. The buffer layer 302 is disposed on the substrate 301, and the buffer layer 302 is made, of for example, GaAs. The channel layer 304 is disposed on the buffer layer 302, and the channel layer 304 is made of, for example, InGaAs. The barrier layer 306 is disposed on the channel layer 304, and the barrier layer 306 is made of, for example, n-AlGaAs. The gate 308 is disposed on the barrier layer 306, and it is, for example, a T-gate. The cover layer 310 is disposed on the barrier layer 306 on both sides of the gate 308, and the source 312a and the drain 312b are disposed on the cover layer 310 on both sides of the gate 308 respectively. An isolation layer 314 can be disposed between the channel layer 304 and the barrier layer 306, and the material of the isolation layer 314 is, for example, AlGaAs.

Such interconnect includes an adhesion layer 318, a diffusion barrier layer 320, and an adhesion layer 322 as well as a copper air bridge 324. The adhesion layers 318, 322 are made of, for example, titanium, titanium tungsten alloy or chromium, with the thickness of 100 Å to 5000 Å. The diffusion barrier layer 320 is made of, for example, Ta, TaN, W, WNx, TiWNx or Pd, with the thickness of 100 Å to 8000 Å. The copper air bridge 324 is disposed on the adhesion layer 322 and a part of the substrate 301, so that the source 312a and the drain 312b are electrically connected to the substrate 301. Moreover, the interconnect structure has a space 326 full of air. Alternatively, in another embodiment, the space 326 is filled by a dielectric material and considered as an intermediate layer. If the space 326 is filled by a dielectric material, the structure 324 and 326 constitute a copper bridge.

A stacked-layer structure of adhesion layer/diffusion barrier layer/adhesion layer is formed at the interface between the group III-V semiconductor device and the copper wire line (copper air bridge or copper bridge) in the present invention, so as to ensure the diffusion barrier layer adhere to the source, drain, dielectric layer and copper wire line effectively, thus preventing the diffusion of the copper interconnect into the GaAs substrate Embodiment 4

Figure 4:
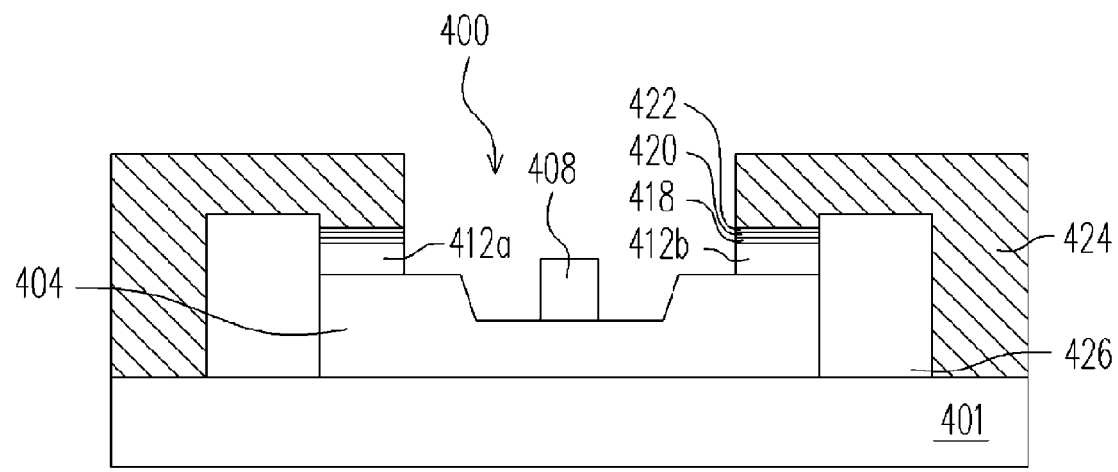
FIG. 4 is a schematic cross-sectional view of the interconnect of the group III-V semiconductor device according to Embodiment 4 of the present invention.

FIG. 4 is a schematic cross-sectional view of the interconnect of the group III-V semiconductor device according to the present invention. This group III-V semiconductor device is, for example, a GaAs device. Referring to FIG. 4 initially, this interconnect is applicable for the group III-V semiconductor device 400. In this embodiment, the group III-V semiconductor device 400 is a metal-semiconductor field-effect transistor, but is not limited to this. Alternatively, the group III-V semiconductor device 400 may be a hetero-junction bipolar transistor, a high electron mobility transistor or a monolithic microwave integrated circuit. This group III-V semiconductor device 400 is constituted by a substrate 401, channel layer 404, gate 408, source 412a and drain 412b. The substrate 401 is made of, for example, GaAs. The channel layer 404 is disposed on the substrate 401, and the channel layer 404 is made of, for example, n-GaAs. The gate 408 is disposed on the channel layer 404, and the source 412a and the drain 412b are disposed on the channel layer 404 on both sides of the gate 408.

Such interconnect includes an adhesion layer 418, a diffusion barrier layer 420, an adhesion layer 422 and a copper air bridge 424. The adhesion layer 418 is disposed on the source 412a and the drain 412b, and the diffusion barrier layer 420 is disposed on the adhesion layer 418, and the adhesion layer 422 is disposed on the diffusion barrier layer 420. The adhesion layers 418, 422 are made of, for example, titanium, titanium tungsten alloy or chromium, with the thickness of 100 Å to 5000 Å. The diffusion barrier layer 420 is made of, for example, Ta, TaN, W, WNx, TiWNx or Pd, with the thickness of 100 Å to 8000 Å. The copper air bridge 424 is disposed on the adhesion layer 422 and a part of the substrate 401, so that the source 412a and the drain 412b are electrically connected to the substrate 401. Moreover, this interconnect structure further includes a space 426 full of air. Alternatively, in the other embodiment, the space 426 is filled by a dielectric material and considered as an intermediate layer.

A stacked-layer structure of adhesion layer/diffusion barrier layer/adhesion layer is formed at the interface between the group III-V semiconductor device and the interconnect in the present invention, so as to ensure the diffusion barrier layer adhere to the source, drain, dielectric layer and copper wire line effectively, thus keeping the copper of the copper wire line from diffusing into the source and drain.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An interconnect of a group III-V semiconductor device, suitable for connecting the group III-V semiconductor device, wherein the group III-V semiconductor device comprises at least a substrate, a dielectric layer, a metal layer, a source, and a drain, the interconnect comprising:
   a first adhesion layer disposed directly on the metal layer, or on the source region and the drain region of a part of the group III-V semiconductor device wherein the metal layer, and the source region and the drain region are configured above the substrate;
   a diffusion barrier layer disposed on the first adhesion layer;
   a second adhesion layer disposed on the diffusion barrier layer; and
   a copper wire line disposed on the second adhesion layer, wherein the copper wire line comprises a copper bridge having a U-shaped structure and two arms of the U-shaped structure are disposed on the second adhesion layer
      wherein the first adhesion layer and the second adhesion layer are constituted with a material that includes titanium tungsten alloy or chromium, and the diffusion barrier layer is constituted with palladium (Pd), wherein a thickness of the first adhesion layer and the second adhesion layer is about 200 Å to 5000 Å, and a thickness of the diffusion barrier layer is about 1500 Å to 8000 Å.

2. The interconnect of the group III-V semiconductor device according to claim 1, wherein the group III-V semiconductor device comprises a hetero junction bipolar transistor (HBT).

3. The interconnect of the group III-V semiconductor device according to claim 1, wherein the copper bridge comprises a copper air bridge.

4. The interconnect of the group III-V semiconductor device according to claim 3, wherein the group III-V semiconductor device is a high electron mobility transistor (HEMT) or a metal-semiconductor field-effect transistor (MESFET).

5. The interconnect of the group III-V semiconductor device according to claim 1, wherein the group III-V semiconductor device is a high electron mobility transistor (HEMT) or a metal-semiconductor field-effect transistor (MESFET).

6. The interconnect of the group III-V semiconductor device according to claim 1, wherein the group III-V semiconductor device comprises a GaAs, InP and GaN device.

7. An interconnect of a group III-V semiconductor device, suitable for connecting the group III-V semiconductor device, wherein the group III-V semiconductor device comprises two conductive layers, the interconnect comprising:
   a first adhesion layer disposed directly on the two conductive layers;
   a diffusion barrier layer disposed on the first adhesion layer;
   a second adhesion layer disposed on the diffusion barrier layer, wherein the second adhesion layer and the first adhesion layer are formed in the same method; and
   a copper bridge, a U-shaped structure having two arms disposed on the second adhesion layer and connecting the two conductive layers, wherein an air gap is enclosed by the two arms and a bottom surface of the U-shaped structure,
      wherein the first adhesion layer and the second adhesion layer are constituted with a material that includes titanium tungsten alloy or chromium, and the diffusion barrier layer is constituted with palladium, wherein a thickness of the first adhesion layer and the second adhesion layer is about 200 Å to 5000 Å, and a thickness of the diffusion barrier layer is about 1500 Å to 8000 Å.

8. The interconnect of the group III-V semiconductor device according to claim 7, wherein the group III-V semiconductor device comprises a hetero junction bipolar transistor (HBT).

9. The interconnect of the group III-V semiconductor device according to claim 7, wherein the copper bridge comprises a copper air bridge.

10. The interconnect of the group III-V semiconductor device according to claim 9, wherein the group semiconductor device is a high electron mobility transistor (HEMT) or a metal-semiconductor field-effect transistor (MESFET).

11. The interconnect of the group III-V semiconductor device according to claim 7, wherein the group III-V semiconductor device comprises a GaAs InP and GaN device.

* * * * *